US007768021B2

(12) United States Patent
Takeuchi (10) Patent No.: US 7,768,021 B2
(45) Date of Patent: Aug. 3, 2010

(54) LIGHT EMITTING ELEMENT ARRAY AND IMAGE FORMING APPARATUS

(75) Inventor: Tetsuya Takeuchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/609,595

(22) Filed: Dec. 12, 2006

(65) Prior Publication Data

US 2007/0131950 A1    Jun. 14, 2007

(30) Foreign Application Priority Data

Dec. 13, 2005    (JP) .............................. 2005-358999

(51) Int. Cl.
*H01L 29/207*    (2006.01)
(52) U.S. Cl. .......................... 257/93; 257/13; 257/103; 257/918; 257/E21.387; 257/E21.407; 438/22; 438/47; 438/69; 438/493; 438/503
(58) Field of Classification Search .................. 257/13, 257/79–103, 918, E21.387, E21.407; 438/22–47, 438/69, 493, 503, 507, 956
See application file for complete search history.

(56) References Cited

U.S. PATENT DOCUMENTS

| 4,993,036 | A | * | 2/1991 | Ikeda et al. ............... 372/50.12 |
| 5,055,893 | A | * | 10/1991 | Sasagawa ..................... 257/88 |
| 5,384,359 | A | | 1/1995 | Chambers et al. ............. 525/64 |
| 5,438,085 | A | * | 8/1995 | Burkett ......................... 257/88 |
| 5,483,085 | A | * | 8/1995 | Holm et al. .................... 257/88 |
| 5,523,825 | A | * | 6/1996 | Satoh et al. .................. 355/251 |
| 6,410,942 | B1 | * | 6/2002 | Thibeault et al. .............. 257/88 |
| 7,015,120 | B2 | * | 3/2006 | Taylor et al. ................. 438/479 |
| 7,271,420 | B2 | * | 9/2007 | Cao ............................. 257/89 |
| 2004/0110316 | A1 | * | 6/2004 | Ogihara et al. ................ 438/26 |
| 2006/0274805 | A1 | * | 12/2006 | Song et al. ............. 372/50.124 |

FOREIGN PATENT DOCUMENTS

| JP | 3-185049 | 8/1991 |
| JP | 3-236463 | 10/1991 |
| JP | 9-232626 | 9/1997 |
| JP | 2005-19946 | 1/2005 |

OTHER PUBLICATIONS

U.S. Appl. No. 11/176,696, filed Jul. 2005, Cao.*
Konagai, M. et al, "High Efficiency GaAs Thin Film Solar Cells by Peeled Film Technology," Journal of Crystal Growth, vol. 45, pp. 277-280 (1978).

* cited by examiner

*Primary Examiner*—Cuong Q Nguyen
*Assistant Examiner*—Cathy N Lam
(74) *Attorney, Agent, or Firm*—Fitzpatrick, Cella, Harper & Scinto

(57) ABSTRACT

A light emitting element array including an active layer commonly used for light emitting element regions, carrier injection layers which are electrically isolated from each other and which are provided in the respective light emitting element regions, and a resistive layer which has a resistance higher than that of the carrier injection layers and which is provided between the active layer and the carrier injection layers.

22 Claims, 6 Drawing Sheets

FIG. 11

LIGHT EMITTING ELEMENT ARRAY AND IMAGE FORMING APPARATUS

BACKGROUND OF THE INVENTION

1. Field of the Invention

The present invention relates to a light emitting element array and an image forming apparatus utilizing that array.

2. Description of the Related Art

As an exposure light source embodying a light emitting element array in which several thousands of light emitting diodes and the like are arranged in a predetermined manner has been used for an electrophotographic printer. For example, element structures each formed of several AlGaAs layers are provided on a compound semiconductor substrate made of GaAs, and an array configuration is formed from the element structures (see Japanese Patent No. 3185049).

When a light emitting element array is used for printers, it is necessary to determine an element size and a distance between elements in accordance with a desired degree of print resolution. When the resolution is represented by 600 dots per inch, the element size must be 40 µm square or less, and the distance between elements must be about 40 µm. In addition, when the resolution is represented by 1,200 dots per inch, the element size and the distance between elements are necessarily decreased to half or less of the above respective values. These elemental sizes are smaller by approximately two orders of magnitude in terms of area than the size (approximately 200 µm square or more) of a general light emitting diode. Furthermore, these small elements are required to be separately operated.

In order to form an array having small light emitting elements which can be separately driven as described above, it is necessary to electrically isolate elements adjacent to each other, and as methods therefor, for example, the following two may be mentioned. As a first method, a pn junction structure is uniformly formed during epitaxial growth, followed by element isolation by etching (Japanese Patent No. 3426834); and as a second method, element isolation is performed by selective diffusion of Zn which is a p-type impurity (Japanese Patent No. 3236463).

SUMMARY OF THE INVENTION

Element isolation by etching, which is one of related element isolation methods, has been used for general light emitting diodes. When etching is performed from a surface layer (such as a p-type layer) to a layer which is provided under an active layer and which has a conductive type (such as an n-type layer) opposite to that of the surface layer, the element isolation can be attained.

However, when the opposite conductive type layer present under the active layer is etched, the active layer is inevitably partly exposed at an element side surface. In particular, when an AlGaAs layer is formed as the active layer, non-radiative recombination occurs at the exposed portion. Since this non-radiative recombination itself does not contribute to light emission, the current component through the non-radiative recombination is just wasted. That is, when the active layer is partly exposed, as a result, the light emission efficiency in a low current injection region is decreased.

Figure 11:
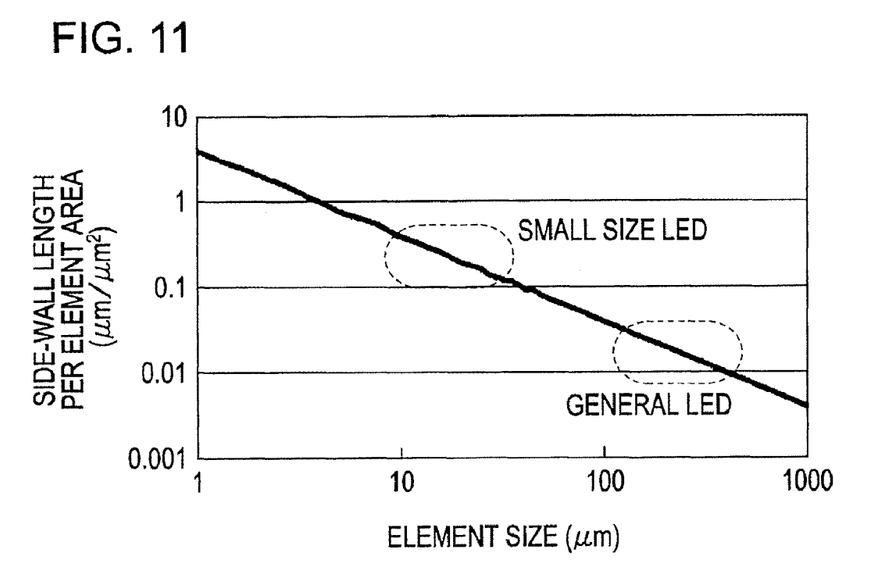
FIG. 11 is a graph showing the relationship between a light emitting element size and a side-wall length per element area.

Specifically, as shown in FIG. 11, in a region of an element having a size of 40 µm or less, that is, in a region which has a smaller area by approximately two orders of magnitude than that of a general LED element having a size of 200 µm, a side-wall length per element area is increased by approximately one order of magnitude. Accordingly, the influence on the light emission efficiency caused by the exposure of the active layer is serious as compared to that of a general light emitting diode. Hence, when element isolation is performed so as to expose the active layer, in order to obtain necessary light output power, the amount of injection current must be increased. As a result, degradation in element properties and in the element itself may occur due to heat generation in some cases.

On the other hand, in the method using the Zn diffusion, since the active layer is not exposed, the problems described above are not serious, and it is believed that the light emission efficiency in a low current injection region is relatively superior. However, for the Zn diffusion, a high-temperature and long-time process (for example, by a heat treatment at 700° C. for 30 minutes) must be performed. Accordingly, there has been a restriction in terms of the production process, that is, the diffusion process must be completed prior to a process for forming a metal electrode.

Furthermore, in order to improve the light emission efficiency, the effectiveness of an active layer having a quantum well structure has been recognized; however, since the quantum well structure is generally a multilayer structure, an intermixing among AlGaAs multilayers is unfavorably caused by the Zn diffusion. Hence, in general, it is very difficult to maintain the quantum well structure after the Zn diffusion. In addition, in the Zn diffusion method, the diffusion area and the diffusion depth are basically controlled by time, and when an array having a great number of elements is formed, uniformity cannot be easily ensured.

The present invention aims to solve the above problems and, in particular, it provides a light emitting element having a low leak current and excellent light emission efficiency.

A light emitting element array having a plurality of light emitting regions of the present invention comprises: a plurality of carrier injection layers which are electrically isolated from each other and which are provided in the respective light emitting element regions, an isolation region for isolating the plurality of carrier injection layers, an active layer for emitting light by being injected with carriers from the plurality of carrier injection layers, and a resistive layer which has a resistance higher than that of the carrier injection layers and which is provided between the active layer and the carrier injection layers. The active layer is a layer common to the plurality of carrier injection layers and is not isolated in the respective light emitting element regions. In addition, according to the present invention, in a light emitting element array containing at least two light emitting elements, a resistive layer is provided on an active layer. Also, carrier injection layers isolated from each other are provided on the resistive layer for the respective light emitting elements. The resistance of a part of the resistive layer located between the carrier injection layers is higher than that of the carrier injection layers. Also, the isolation of the carrier injection layers is performed by etching, and this etching can be stopped by the resistive layer. In addition, an etching stop layer can be provided between the resistive layer and the carrier injection layers.

Moreover, according to the present invention, when the resistive layer is provided on the active layer, the electrical isolation at the element isolation region can be improved, and a leak current between elements can be decreased. That is, a wasted current component in a low current injection region can be decreased, and as a result, an element array having high light emission efficiency can be realized. Also, since the isolation of the light emitting elements is performed by etching, and the etching is stopped by the resistive layer, the active layer is not exposed, and hence the non-radiative component can be decreased. Accordingly, in addition to the above-described effect of suppressing a leak current, since the wasted current component which has no contribution to light emission can be decreased, an element array having high light emission efficiency can be realized. In addition, according to the present invention, since the etching stop layer is further provided, highly accurate and highly uniform element formation and element isolation can be realized without being affected by etching time.

Further features of the present invention will become apparent from the following description of exemplary embodiments with reference to the attached drawings.

DESCRIPTION OF THE EMBODIMENTS

Hereinafter, the embodiments of the present invention will be described with reference to the drawings.

First Embodiment

Figure 1:
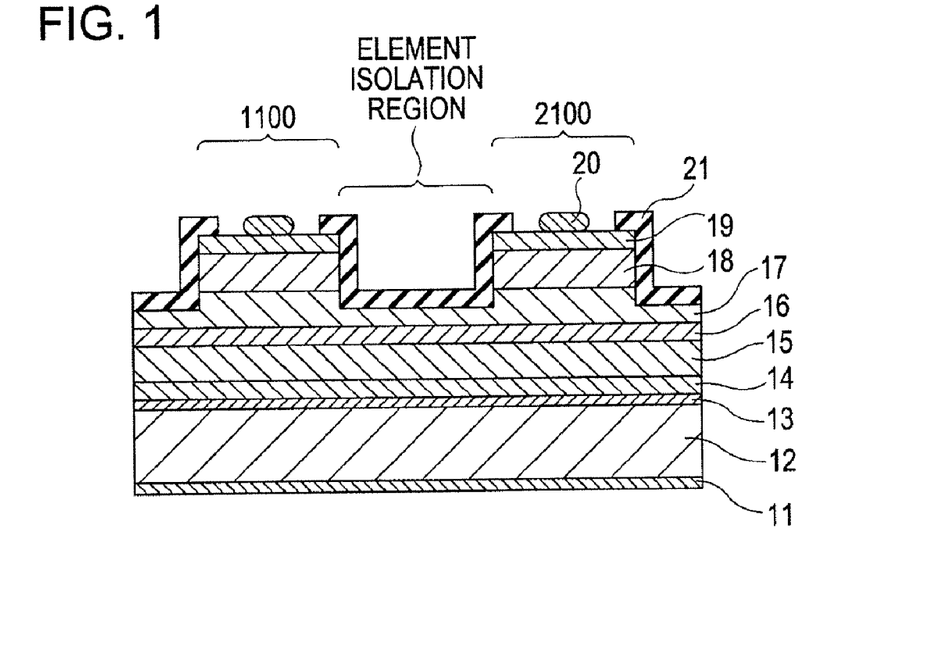
FIG. 1 is a cross-sectional view of a light emitting element array according to a first embodiment of the present invention.

FIG. 1 is a cross-sectional view of a light emitting element array of a first embodiment according to the present invention. In this embodiment, the light emitting element array has an n-side electrode 11, an n-type Si substrate 12, a metal mirror 13, an n-type GaAs layer 14, an n-type AlGaAs layer 15, an AlGaAs quantum well active layer 16, and an undoped AlGaAs resistive layer 17. In addition, on the undoped AlGaAs resistive layer 17 are provided a p-type AlGaAs layer 18 functioning as a carrier injection layer (a hole injection layer in this embodiment), a p-type GaAs layer 19, a p-side electrode 20, and an insulating film 21. In order to achieve the element isolation, the p-type GaAs layer 19 and the p-type AlGaAs layer 18 are sequentially etched, and the AlGaAs resistive layer 17 is also partly etched. In FIG. 1, reference numeral 1100 indicates a first light emitting element region, and reference numeral 2100 indicates a second light emitting element region.

Figure 2:
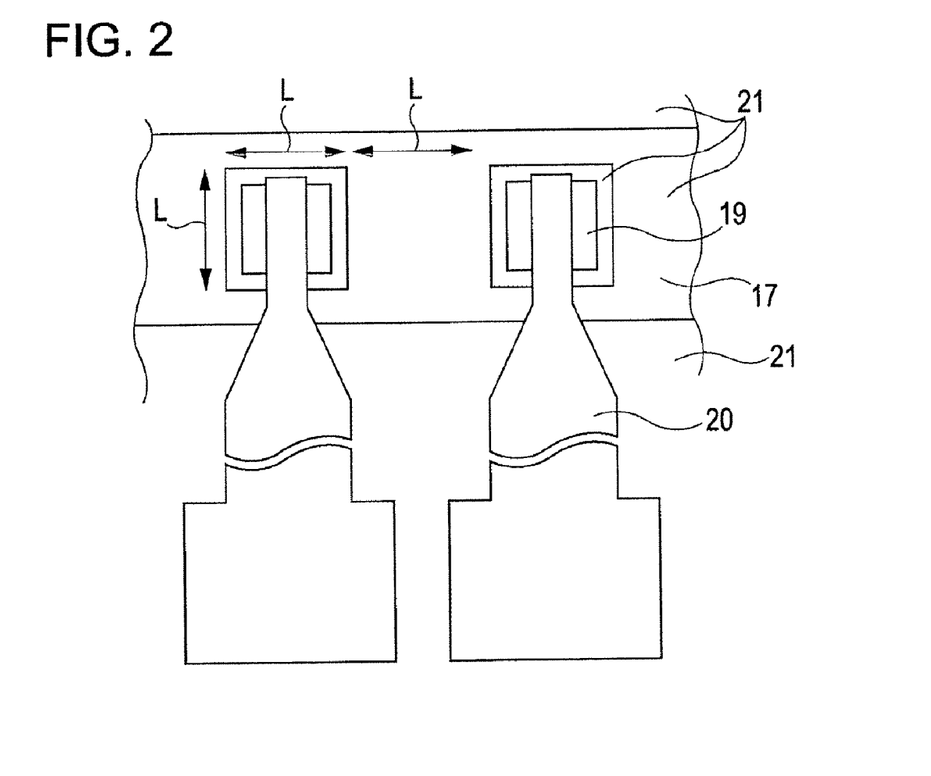
FIG. 2 is a plan view of the light emitting element array according to the first embodiment of the present invention.

FIG. 2 is a plan view of the light emitting element array of this embodiment according to the present invention. In this embodiment, at least two elements each having a size of 20 μm square (in FIG. 2, L is 20 μm) are separately formed by etching, and the p-side electrodes 20 are formed for the respective elements. In the region processed by etching, the undoped AlGaAs resistive layer 17 is exposed, and the active layer 16 is not exposed. The insulating film 21 is then deposited after etching, so that the electrical isolation is performed. Furthermore, since the p-side electrodes 20 are formed so that necessary parts thereof are only directly contacted with the respective p-type GaAs layers 19, it is configured that current can be injected into the light emitting elements. Since the other parts of the p-side electrodes are formed on the insulating film, the current injection regions, that is, the light emitting regions, are configured not to be carelessly increased, and in addition, a sufficiently large p-side electrode surface is provided for forming electrical conduction by wire bonding.

Next, processes for forming the element array of this embodiment will be described.

Figure 3:
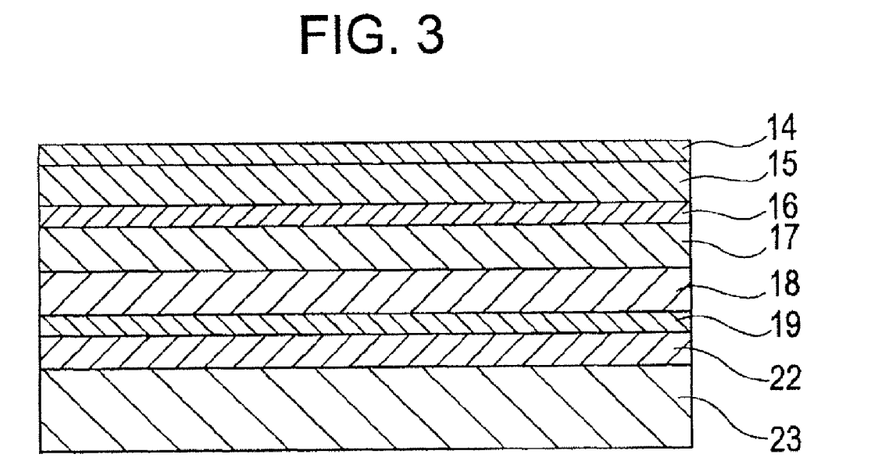
FIG. 3 is a cross-sectional view illustrating a step of manufacturing the element array according to the first embodiment of the present invention.

First, as shown in FIG. 3, an element layer structure, which is inverse to the layer structure shown in FIG. 1, is formed on a GaAs substrate by epitaxial growth. That is, as element forming layers, the p-type GaAs layer 19, the p-type AlGaAs layer 18, the undoped AlGaAs resistive layer 17, the AlGaAs quantum well active layer 16, the n-type AlGaAs layer 15, and the n-type GaAs layer 14 are formed on a GaAs substrate 23. In this process, an AlAs selective etch separation layer 22 is inserted under the p-type GaAs layer 19 which is an inverse element forming layer.

Figure 4:
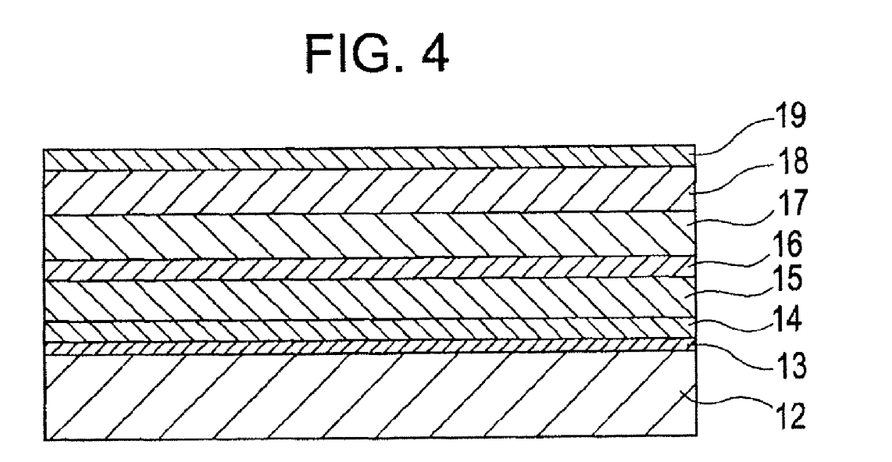
FIG. 4 is a cross-sectional view illustrating another step of manufacturing the element array according to the first embodiment of the present invention.

This AlAs selective etch separation layer 22 is selective-etched later and is used to separate the GaAs substrate 23 from the element forming layers (M. Konagai, M. Sugimoto, and T. Takahashi, J. Cryst. Growth, 45. 277 (1978)). Metal films are formed on a surface of the wafer having the epitaxially grown layers and a surface of a Si substrate 12 which is separately prepared as a support substrate. After the metal films thus formed are adhered to each other, the AlAs selective etch separation layer 22 is selective-etched by immersing it in a hydrofluoric acid solution so that the element forming layers are transferred on the Si substrate 12, and as a result, a wafer having the metal film which is to be used as a metal mirror 13, as shown in FIG. 4, is formed.

In this embodiment, a wafer which does not have the metal film and/or the quantum well active layer, as described above, also exhibits a sufficient effect; however, when the wafer as described above is used, the effect of the present invention is further enhanced. In particular, since the metal film is present under the element structure as a reflection mirror, light propagating toward the substrate side can be obtained at the surface side by reflection on the metal film, and hence the light output power is increased. In addition, since the Si substrate is used as a support substrate, compared to the case of a GaAs substrate, the thermal properties are also improved. Furthermore, since the quantum well active layer can be used, the light emission efficiency is further improved.

Subsequently, patterning is performed on this wafer using a photolithographic technique, and element isolation is then performed using a wet etching technique. In this embodiment, the size of and the distance (L) between elements are set to 20 μm square and 20 μm, respectively, as shown in FIG. 2. The p-type GaAs layer 19 and the p-type AlGaAs layer 18 are sequentially etched in that order using a sulfuric acid-based or a phosphoric acid-based etchant. When the etchant reaches the AlGaAs resistive layer 17 present on the active layer 16, the etching is stopped. Accordingly, since the active layer 16 is not exposed, the non-radiative component can be decreased as small as possible.

In addition, since only the AlGaAs resistive layer 17 is present on the active layer located in the element isolation region, a leak current which does not pass through the active layer 16 can also be decreased to as small as possible. By the above-described two effects, the light emission efficiency in a low current injection region can be significantly improved.

When the AlGaAs resistive layer 17 has a resistance higher than that of the p-type AlGaAs layer 18, compared to the case in which a p-type AlGaAs layer is directly provided on the active layer located in the element isolation region with no resistive layer interposed therebetween, a leak current can be effectively decreased. However, when it is intended to further decrease a leak current, the resistance of the AlGaAs resistive layer 17 is preferably 5 times or more higher than that of the p-type AlGaAs layer 18 which is formed as a carrier injection layer. Furthermore, the resistance is more preferably 10 times or more higher than that of the p-type AlGaAs layer 18, and can be increased to 100 times or more higher than that of the p-type AlGaAs layer 18.

In this embodiment, in order to sufficiently increase the resistance, the AlGaAs resistive layer 17 is an undoped layer, and the carrier concentration thereof is $1 \times 10^{16}$ cm$^{-3}$ or less. In order to obtain sufficient element isolation, the carrier concentration of this resistive layer, that is, the doping concentration, is preferably $3 \times 10^{17}$ cm$^{-3}$ or less when the dopant is a p-type dopant. When the dopant is an n-type dopant, the doping concentration of the resistive layer is preferably $3 \times 10^{16}$ cm$^{-3}$ or less. As the p-type dopant, for example, C, Zn, Mg, and Be can be used, and as the n-type dopant, for example, Si, Ge, Te, Se, and S can be used. In this embodiment, the carrier concentration of the AlGaAs resistive layer 17 is set to be uniform over the element regions and the element isolation regions; however, the carrier concentration in the element isolation region may be decreased as compared to that in the element region. That is, the effect of decreasing a leak current can be obtained at least when the resistance of the resistive layer in the element isolation region is high. Accordingly, while the doping concentration of the resistive layer in the element isolation region is set in the range described above, the doping concentration of the resistive layer in the element region may be increased.

In addition, the thickness of this resistive layer before etching is set to 0.1 μm, and the thickness of the resistive layer in the element isolation region after etching is set to 0.04 μm (the thickness before etching is set to approximately 0.1 μm and the thickness after etching is set to approximately 0.04 μm as described in comparative sample 2 which will be described below). When the thickness of this layer is too small, carriers diffuse from the active layer and reach non-radiative recombination sites present on the etched surface, and as a result, a wasted current component may be increased in some cases. Furthermore, by etching controlled by time, it is difficult to stop the etching within the resistive layer. On the other hand, when the thickness of the resistive layer is too large, increases in element resistance, production cost, and the like may occur, and hence it is understood that an effective thickness range is present. Accordingly, the thickness of the resistive layer after etching is preferably set to 0.002 to 0.5 μm, and is more preferably set to 0.01 to 0.1 μm.

The process described above is an element isolation process for forming an array. Subsequently, the insulating film 21 is deposited, and by patterning and etching of the insulating film 21, a contact hole is formed in the insulating film 21 so that a contact portion of the p-type electrode is directly bonded to a contact portion of the element. Next, after patterning is again performed, the p-type electrode 20 is formed by deposition and lift-off. In addition, after the n-side electrode 11 is deposited on the rear side of the Si substrate, a chip having a desired shape is cut away, so that an array chip is formed.

Figure 5:
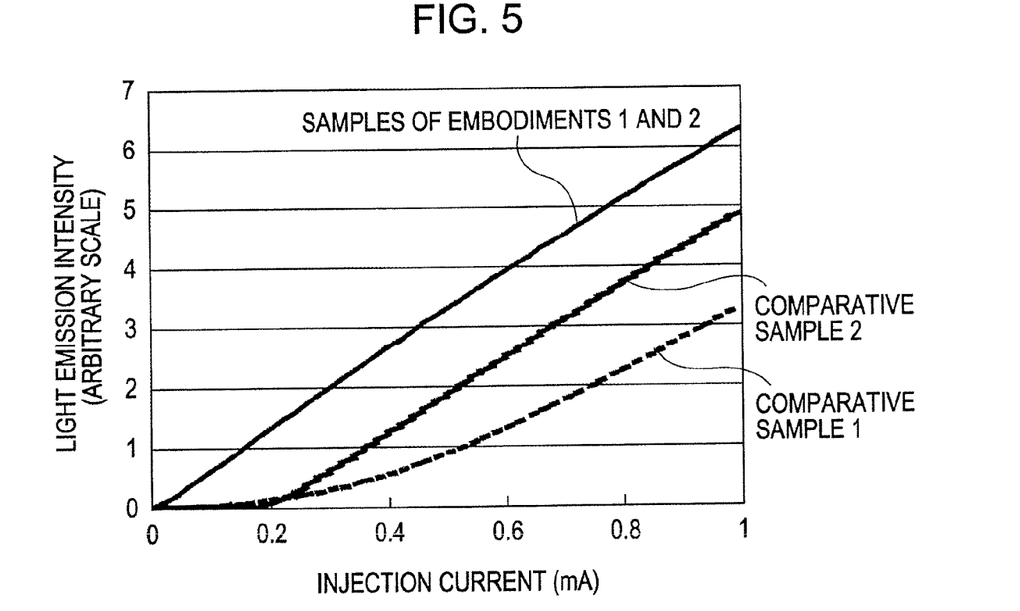
FIG. 5 is a graph showing the relationship between light output power of a light emitting element array and injection current.

The light output power of the light emitting element array thus formed with injection current was measured. The result is shown in FIG. 5. As comparative samples, two types of elements were prepared besides the element of this embodiment. In one comparative sample (comparative sample 1), wet etching for element isolation penetrated the quantum well active layer and reached the n-side AlGaAs layer, that is, the active layer was partly exposed. In the other comparative sample (comparative sample 2), etching for element isolation did not reach the active layer. In this comparative sample 2, the resistive layer is not present on the active layer, and even after the etching for element isolation, a p-type AlGaAs layer having a thickness of approximately 0.04 μm, that is, a conductive layer, remains in the element isolation region.

Figure 6:
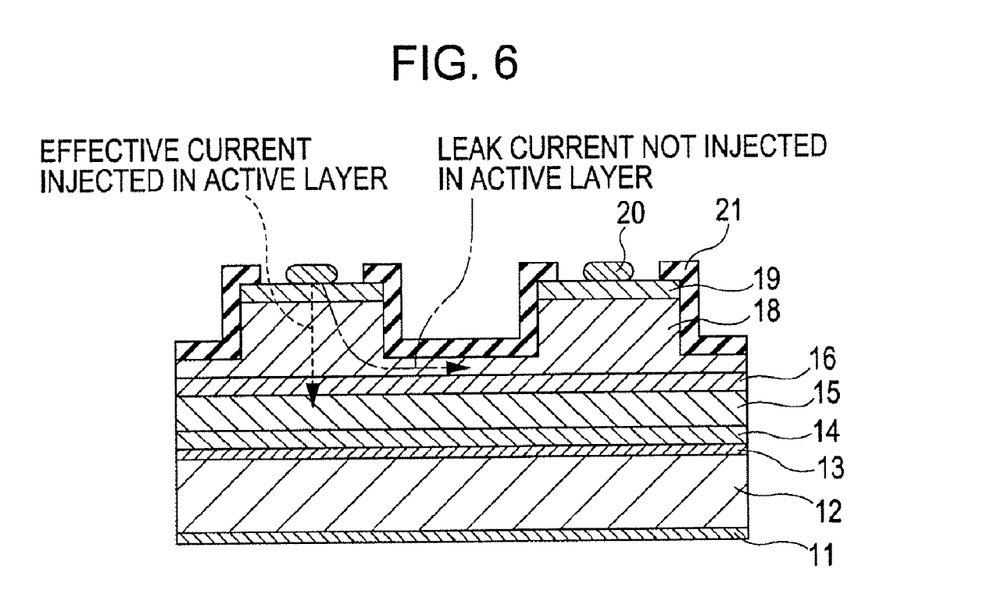
FIG. 6 is a cross-sectional view showing a leak current of a light emitting element array.

The light output power of comparative sample 2 is improved in a relatively high current injection region (0.5 mA or more) as compared to that of comparative sample 1. The reason for this is believed that since the active layer is not exposed by etching, the non-radiative component is significantly decreased. However, in a low current injection region (0.2 mA or less), the improvement is not clearly observed. The reason for this is believed that although the non-radiative component is decreased, a leak current via the conductive layer remaining in the element isolation region then becomes apparent as shown in FIG. 6, and as a result, current is not injected in the active layer particularly in the low current injection region.

On the other hand, in the sample of this embodiment, since the active layer is not exposed, the non-radiative component is decreased, and in addition, since only the resistive layer is present in the element isolation region, the leak current is very low; hence, light emission is observed immediately after the start of current injection. Accordingly, it is to be understood that the present invention has a very significant meaning.

In addition, a method has been disclosed in which an etching stop layer is provided on the active layer, and etching for element isolation is stopped by the etching stop layer so as not to expose the active layer (Japanese Patent Laid-Open No. 2005-19946).

However, this method is aimed to decrease leak light from etched portions, and improvement in light emission efficiency in a low current injection region has not been taken into consideration at all. That is, when the etching does not reach the active layer, the non-radiative component can be suppressed; however, according to the method as described above, the resistive layer of the present invention is not present, and a p-type stop layer is only present. Accordingly, a leak current flowing between elements via this stop layer, that is, a wasted current component, is unfavorably generated.

On the other hand, according to the embodiment of the present invention, since the above-described resistive layer is used, the wasted current component can be effectively decreased.

Second Embodiment

Figure 7:
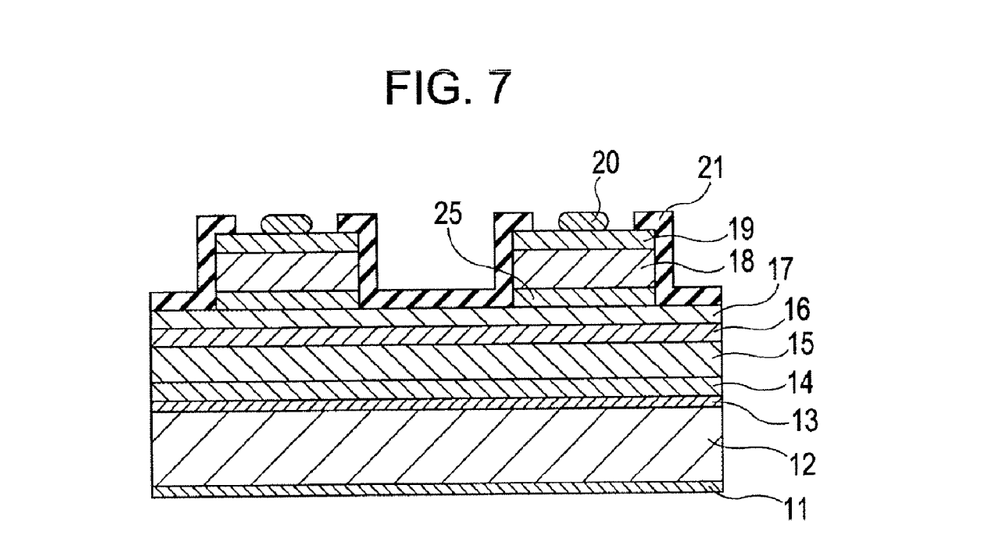
FIG. 7 is a cross-sectional view of a light emitting element array according to a second embodiment of the present invention.

FIG. 7 is a cross-sectional view of a light emitting element array of the second embodiment according to the present invention. In FIG. 7, the same reference numerals as in FIG. 1 designate the same constituent elements, and a description thereof will be omitted. In this embodiment, which is different from that described with reference to FIG. 1, an AlInGaP etching stop layer 25 is formed on the AlGaAs resistive layer 17. Since etching is automatically stopped by this AlInGaP etching stop layer 25, more uniform element isolation can be realized.

Figure 8:
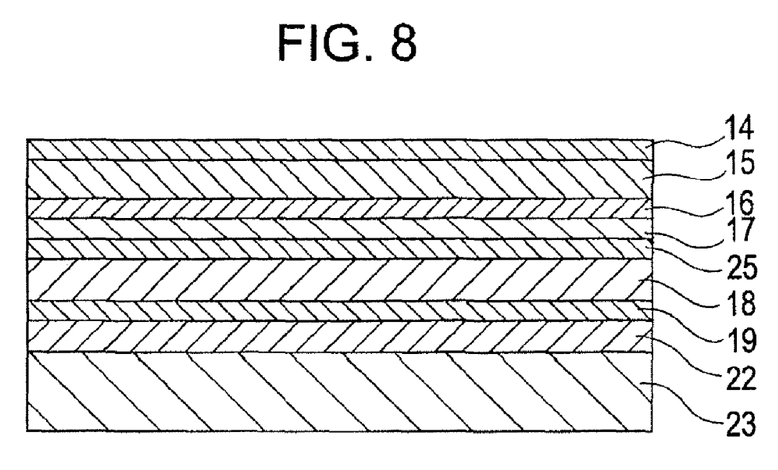
FIG. 8 is a cross-sectional view illustrating a step of manufacturing the element array according to the second embodiment of the present invention.
Figure 9:
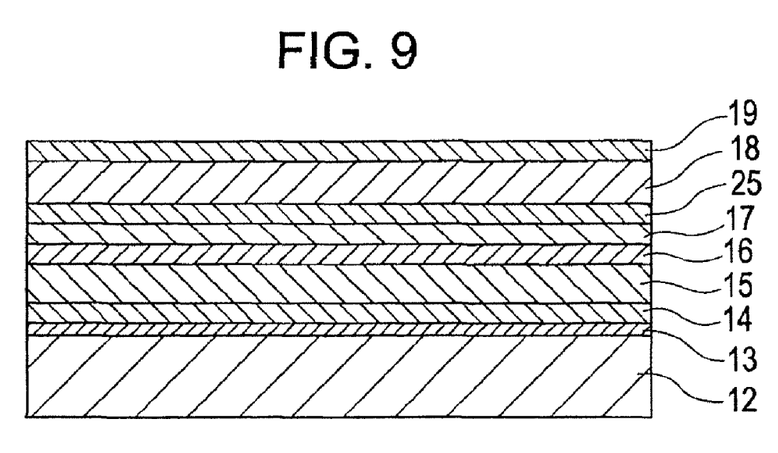
FIG. 9 is a cross-sectional view illustrating another step of manufacturing the element array according to the second embodiment of the present invention.

In a process for forming the element array of this embodiment, as shown in FIG. 8, an element layer structure, which is inverse to a layer structure shown in FIG. 7, is formed on the GaAs substrate 23 by epitaxial growth. In this process, the AlAs selective etch separation layer 22 is inserted under the entire inverse structure. This AlAs selective etch separation layer 22 will be selective-etched in a subsequent step, so that the GaAs substrate 23 will be separated from the element forming layers. Metal films are formed on a surface of the wafer having the epitaxially grown layers and a surface of the Si substrate 12 which is separately prepared. After the metal films thus formed are adhered to each other, only the AlAs selective etch separation layer 22 is selective-etched by immersing it in a hydrofluoric acid solution so that the element forming layers are transferred on the Si substrate 12, and as a result, a wafer having the metal film as shown in FIG. 9 is formed.

Subsequently, patterning is performed on this wafer using a photolithographic technique, and element isolation is then performed using a wet etching technique. In this embodiment, as is the case shown in FIG. 2, the size of and the distance (L) between elements are set to 20 μm square and 20 μm, respectively. The p-type GaAs layer 19 and the p-type AlGaAs layer 18 are sequentially etched in that order using a sulfuric acid-based or a phosphoric acid-based etchant. When the etching reaches the AlInGaP etching stop layer 25, etching does not substantially proceed, and as a result, etching can be performed in the depth direction with excellent accuracy. Subsequently, the exposed AlInGaP etching stop layer 25 is removed by a hydrochloric acid-based etchant, so that the AlGaAs resistive layer 17 is exposed. In this step, since the hydrochloric acid-based etchant does not etch the AlGaAs resistive layer 17, only the AlInGaP etching stop layer 25 can be etched with high accuracy. In this embodiment, the thickness of the AlInGaP etching stop layer 25 was set to 0.02 μm. When the thickness of the AlInGaP etching stop layer 25 is excessively small, the function as the etching stop layer cannot be obtained, and when the thickness is too large, for example, the increase in element resistance and/or the increase in production cost may occur. Hence, a preferable thickness range (0.002 to 0.5 μm) is present. Furthermore, the thickness is preferably set in the range of 0.005 to 0.05 μm. In addition, etching of this AlInGaP layer may be omitted, for example, when the AlInGaP etching stop layer 25 has a small thickness even though the carrier concentration thereof is high, or when it has a low carrier concentration even though the thickness is large. In the case described above, even when the etching of the AlInGaP layer is omitted, sufficient element isolation can be obtained, and as a result, this etching step can be omitted. Alternatively, the AlInGaP etching stop layer may also be used as the resistive layer. In the case described above, the carrier concentration is controlled in accordance with the desired purpose. When the dopant is a p-type dopant, the carrier concentration, that is, the doping concentration, is preferably $3\times10^{17}$ cm$^{-3}$ or less. In addition, when the dopant is an n-type dopant, the doping concentration is preferably $3\times10^{16}$ cm$^{-3}$ or less. Furthermore, the AlInGaP etching stop layer 25 may be an undoped layer.

On the other hand, in FIG. 7, the thickness of the undoped AlGaAs resistive layer 17 present between the AlInGap etching stop layer 25 and the active layer 16 is 0.02 μm, and the carrier concentration of the undoped AlGaAs resistive layer 17 is low, such as approximately $1\times10^{16}$ cm$^{-3}$, so that the resistance thereof is high. When the thickness of this layer is too small, carriers diffuse from the active layer and reach non-radiative recombination sites present on the etched surface, and as a result, a wasted current component may be increased in some cases. On the other hand, when the thickness is too large, for example, an increase in element resistance and/or an increase in production cost may occur, and hence an optimum thickness range is present (0.002 to 0.5 μm). Furthermore, the thickness is more preferably set to 0.01 to 0.1 μm. In order to suppress the increase in element resistance, the carrier concentration of this resistive layer, that is, the doping concentration, is preferably $3\times10^{17}$ cm$^{-3}$ or less when the dopant is a p-type dopant. In addition, when the dopant is an n-type dopant, the doping concentration of the resistive layer is preferably $3\times10^{16}$ cm$^{-3}$ or less. As the p-type dopant, for example, C, Zn, Mg, and Be may be mentioned, and as the n-type dopant, for example, Si, Ge, Te, Se, and S can be used. In this embodiment, the carrier concentration of the AlGaAs resistive layer 17 is set to be uniform over the element regions and the element isolation regions; however, the carrier concentration in the element isolation region may be decreased as compared to that in the element region. That is, the effect of decreasing a leak current can be obtained at least when the resistance of the resistive layer in the element isolation region is high. Accordingly, while the doping concentration of the resistive layer in the element isolation region is set in the range described above, the doping concentration of the resistive layer in the element region may be increased.

The process described above is an element isolation process for forming an array. Subsequently, the insulating film 21 is deposited, and by patterning and etching of the insulating film 21, a contact hole is formed in the insulating film 21 so that a contact portion of the p-type electrode is directly bonded to a contact portion of the element. Next, after patterning is again performed, the p-type electrode 20 is formed by lift-off. In addition, after the n-side electrode 11 is deposited on the rear side of the Si substrate, a chip having a desired shape is cut away, so that an array chip is formed. In the case described above, the light output power of the element forming the array with injection current was measured, and the same result as that in the first embodiment was obtained as shown in FIG. 5.

The above light emitting element arrays of the first and the second embodiments are more effectively used, in particular, as the element size is decreased, and when the area of the light emitting region of the light emitting element is 1,600 μm$^2$ (40 μm by 40 μm) or less, that is, when the resolution is 600 dots per inch or more, the present invention is preferably used.

In addition, even when the conductive type of the light emitting element array of the first or the second embodiment described above is changed to an inverse conductive type, that is, even when the n-type is changed to p-type, or the p-type is changed to n-type, the present invention may be used. In this case, the hole injection layer is changed to an electron injection layer.

In addition, in the light emitting element array of the present invention, the AlGaAs-based material described in the embodiments is not only used. That is, materials used for other light emitting devices, such as an AlGaInP-based and an AlGaInN-based material, may also be used, and by using the materials mentioned above, a sufficient effect can also be obtained.

In addition, the active layer of the light emitting element array of the present invention is not limited to the quantum well active layer described in this embodiment, and for example, an AlGaAs active layer having a double heterostructure may also be used; however, when the quantum well active layer is used, the light emission efficiency can be improved.

Next, an application example of the light emitting element array according to the present invention will be described.

Figure 10:
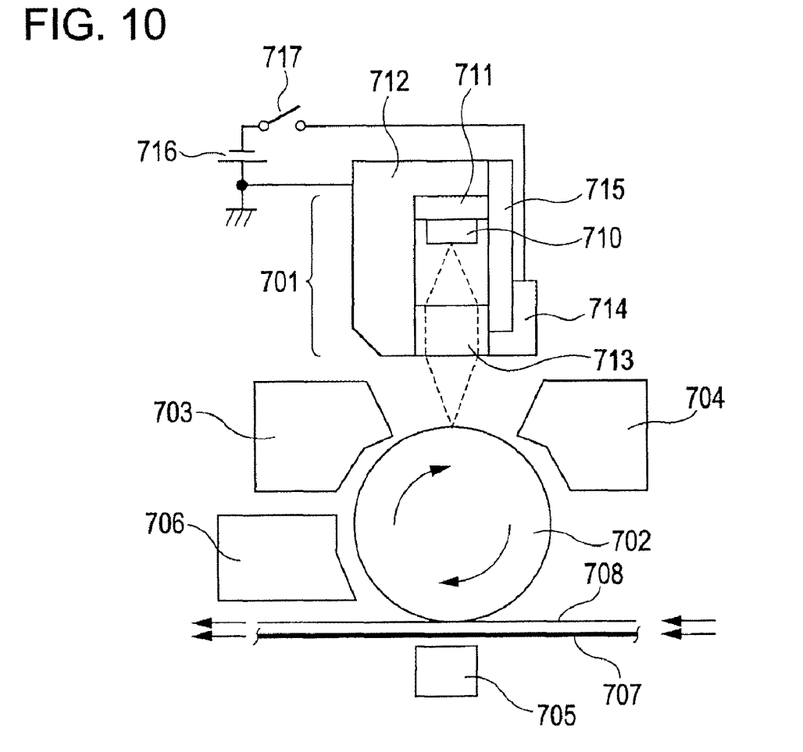
FIG. 10 is a schematic view of an electrophotographic image forming apparatus incorporating a light emitting element array according to one of the above embodiments.

FIG. 10 is a schematic structural view of an electrophotographic recording type image forming apparatus incorporating the light emitting element array according to one of the above embodiments.

In FIG. 10, reference numeral 701 indicates an exposure portion having a light emitting element array semiconductor chip, reference numeral 702 a photoconductive drum functioning as a light receiving portion for the exposure portion, reference numeral 703 a drum charger, and reference numeral 704 a developer for adhering toner to an image on the drum. In addition, reference numeral 705 indicates a transfer device for transferring toner on the drum to paper 708 on a transfer belt 707, and reference numeral 706 a cleaner for removing toner remaining on the photoconductive drum 702 after the transfer.

Next, the inside of the exposure portion 701 will be described. Reference numeral 710 indicates the light emitting element array semiconductor chip, reference numeral 711 a ceramic stage used as the baseline on which the chip array is placed, and reference numeral 712 an aluminum frame used as the baseline for an optical system.

In addition, reference numeral 713 indicates a SELFOC Lens Array (registered trade name sold by Nippon Sheet Glass Co., Ltd., hereinafter simply referred to as "SLA") having focuses on the photoconductive drum 702 and on a light-emission-point line on the light emitting element array semiconductor chip 710, and reference numeral 714 indicates an electrode configured to produce an electric field to prevent dispersion of toner. In addition, reference numeral 715 is a molded member covering and supporting one side of the exposure portion 701 opposite to that of the aluminum frame 712, reference numeral 716 is a power source applying a direct current voltage to the electrode 714, and reference numeral 717 is a switch for the power source.

Next, the flow of image formation on the paper 708 will be described. First, the surface of the photoconductive drum 702 is uniformly and negatively charged by the drum charger 703. Subsequently, exposure is performed on the photoconductive drum 702 by the exposure portion 701 in accordance with an image pattern, and an exposed portion is positively charged, so that an electrostatic latent image is formed. Next, negatively charged toner is supplied from the developer 704 to the electrostatic latent image to adhere onto the positively charged portion, so that a toner image is formed on the photoconductive drum 702. Then, the toner image is transferred onto the paper 708 by the transfer device 705, so that toner image is formed on the paper 708. Finally, toner remaining on the photoconductive drum 702 after the transfer is wiped away by the cleaner 706, and the charging process is again performed.

Accordingly, the present invention may be used for apparatuses using a light emitting element array, such as an electrophotographic recording type image forming apparatus incorporating a light emitting element array.

While the present invention has been described with reference to exemplary embodiments, it is to be understood that the invention is not limited to the disclosed embodiments. The scope of the following claims is to be accorded the broadest interpretation so as to encompass all modifications, equivalent structures and functions.

This application claims the benefit of Japanese Application No. 2005-358999 filed Dec. 13, 2005, which is hereby incorporated by reference herein in its entirety.

What is claimed is:

1. A light emitting element array having a plurality of light emitting element regions, comprising:
    a plurality of carrier injection layers which are provided in the respective light emitting element regions;
    an isolation region for isolating the plurality of carrier injection layers;
    an active layer for emitting light by being injected with carriers from the plurality of carrier injection layers; and
    a resistive layer which has a resistance higher than that of the plurality of carrier injection layers and which is provided between the active layer and the plurality of carrier injection layers,
    wherein the active layer is a layer common to the plurality of carrier injection layers and is not isolated in the respective light emitting element regions,
    wherein the plurality of carrier injection layers are isolated from each other by etching, such that the etching forms an opening as the isolation region, which extends between the plurality of carrier injection layers to a portion of the resistive layer but not to the active layer.

2. The light emitting element array according to claim 1, further comprising a silicon substrate; and a mirror layer provided thereon, wherein the light emitting element regions are provided on the silicon substrate with the minor layer interposed therebetween.

3. The light emitting element array according to claim 1, wherein the resistive layer comprises AlGaAs.

4. The light emitting element array according to claim 3, wherein the resistive layer is a p-type conductive layer and has a p-type doping concentration of $3 \times 10^{17}$ cm$^{-3}$ or less.

5. The light emitting element array according to claim 3, wherein the resistive layer is an n-type conductive layer and has an n-type doping concentration of $3 \times 10^{16}$ cm$^{-3}$ or less.

6. The light emitting element array according to claim 1, wherein the resistive layer is an undoped layer.

7. The light emitting element array according to claim 1, wherein part of the resistive layer between the plurality of carrier injection layers has a doping concentration lower than that of part of the resistive layer under each of the carrier injection layers.

8. The light emitting element array according to claim 1, further comprising an etching stop layer on the resistive layer.

9. The light emitting element array according to claim 8, wherein part of the etching stop layer, which is located between the carrier injection layers, is removed.

10. The light emitting element array according to claim 9, wherein the etching stop layer comprises AlInGaP.

11. The light emitting element array according to claim 8, wherein the etching stop layer is a p-type conductive layer and has a doping concentration of $3 \times 10^{17}$ cm cm$^{-3}$ or less.

12. The light emitting element array according to claim 8, wherein the etching stop layer is an n-type conductive layer and has an n-type doping concentration of $3 \times 10^{16}$ cm cm$^{-3}$ or less.

13. The light emitting element array according to claim 8, wherein the etching stop layer is an undoped layer.

14. The light emitting element array according to claim 1, further comprising metal films in the light emitting element regions.

15. The light emitting element array according to claim 1, wherein the active layer has a quantum well structure.

16. An image forming apparatus comprising:
    the light emitting element array according to claim 1; and image forming means for forming an image using light emitted from the light emitting element regions.

17. An image forming apparatus comprising:
the light emitting element array according to claim 1;
a photoconductive drum for bearing an electrostatic latent image formed by using light emitted from the light emitting element regions; and
a developer.

18. A light emitting element array according to claim 1, wherein the thickness of the resistive layer is 0.002 µm or more and 0.5 µm or less.

19. A light emitting element array according to claim 1, wherein the isolation region includes the resistive layer.

20. A light emitting element array according to claim 1, wherein an area of the plurality of light emitting element regions is 1600 µm².

21. A light emitting element array according to claim 1, wherein the active layer is a layer common to the plurality of carrier injection layers and the isolation region.

22. A light emitting element array having a plurality of light emitting element regions, comprising:
a plurality of carrier injection layers which are provided in the respective light emitting element regions;
an isolation region for isolating the plurality of carrier injection layers;
an active layer for emitting light by being injected with carriers from the plurality of carrier injection layers; and
an undoped resistive layer which has a resistance higher than that of the plurality of carrier injection layers and which is provided between the active layer and the carrier injection layers,
wherein the active layer is a layer common to the plurality of carrier injection layers,
wherein the light emitting element region has a mesa shape, and
wherein the plurality of carrier injection layers are isolated from each other by etching, such that the etching forms an opening as the isolation region, which extends between the plurality of carrier injection layers to a portion of the resistive layer but not to the active layer.

* * * * *